(12) United States Patent
Miyagawa

(10) Patent No.: US 6,519,758 B2
(45) Date of Patent: Feb. 11, 2003

(54) METHOD OF CHECKING EXPOSURE PATTERNS FORMED OVER PHOTO-MASK

(75) Inventor: Seiji Miyagawa, Tokyo (JP)

(73) Assignee: NEC Corporation, Tokyo (JP)

( * ) Notice: Subject to any disclaimer, the term of this patent is extended or adjusted under 35 U.S.C. 154(b) by 97 days.

(21) Appl. No.: 09/739,788

(22) Filed: Dec. 20, 2000

(65) Prior Publication Data

US 2001/0004765 A1 Jun. 21, 2001

(30) Foreign Application Priority Data

Dec. 20, 1999 (JP) ............................................. 11-361069

(51) Int. Cl.[7] ............................................. G06F 17/50
(52) U.S. Cl. ............................. 716/19; 716/2; 716/20; 716/21
(58) Field of Search ................................ 716/2, 11, 19, 716/20, 21

(56) References Cited

U.S. PATENT DOCUMENTS 5,955,227 A * 9/1999 Tsujita et al. .................. 430/30
6,090,527 A * 7/2000 Yamazaki et al. ........... 430/296

* cited by examiner

*Primary Examiner*—Matthew Smith
*Assistant Examiner*—Thuan Do
(74) *Attorney, Agent, or Firm*—Young & Thompson

(57) ABSTRACT

The present invention provides a method of checking exposure patterns with reference to checking data, and the exposure patterns having an overlapping region receiving double-exposures of electron beams which vary a width of an interconnection part across the overlapping region, wherein data for a width of the interconnection part across the overlapping region in the checking data are modified to vary the width of the interconnection part.

50 Claims, 9 Drawing Sheets

B

METHOD OF CHECKING EXPOSURE PATTERNS FORMED OVER PHOTO-MASK

BACKGROUND OF THE INVENTION

The present invention relates to a method of checking exposure patterns formed over a photo-mask, and more particularly to a method of checking exposure patterns formed over a photo-mask, wherein data of a layout-designed mask pattern are used to carry out plural electron beam exposures to a single photo-mask in order to form mask patterns over the single photo-mask.

A photolithography technique is used for manufacturing the semiconductor integrated circuit. The photolithography technique utilizes a photo-mask. This photo-mask comprises a transparent substrate such as a glass substrate with a light-shielding mask pattern of a metal such as chromium. This mask pattern is formed by an electron beam lithography technique which uses an electron beam exposure system. Layout designed data are obtained from design data of semiconductor integrated circuits. The layout design data are used as pattern data to enable the electron beam exposure system to carry out an electron beam exposure. The pattern data comprise combinations of plural rectangle-shaped patterns which represent elements of the semiconductor integrated circuits, for example, gate electrode regions, and source and drain regions. In the photolithography process for forming the mask pattern, a pattern is projected with shrinkage onto a photo-mask, wherein a rate of shrinkage is usually ⅕.

In accordance with the layout design, layout data representing fundamental devices such as transistors have previously been prepared, and combinations thereof are laid-out. Plural layout data are laid-out, and data inter-connecting those layout data are converted into exposure data for the electron beam exposure system.

The prepared layout data are classified into first type layout data for traditional process and second type layout data for advanced process. In order to effectively utilize the first type layout data for traditional process, the exposure data are also divided into first type electron beam exposure data for the traditional process and second type electron beam exposure data for the advanced process, so that plural time exposure processes are carried out for the single photo-mask.

If it is required to convert data of large capacity and high integration for a single chip into the electron beam exposure data, or if it is required to synthesize those data, it might be difficult to process the data due to the limited throughput and the limited capacity of the storage medium. In this case, it is effective that those large capacity and high integration data are divided into plural modules before each module is then converted into the electron beam exposure data. Plural sets of the electron beam exposure data are used for carrying out plural time exposure processes for the single photo-mask.

The junction portions of the different mask patterns are double-exposed. A countermeasure is made to prevent any formation of a slit due to miss-alignment of the plural time exposures.

Namely, if the single photo-mask is subjected to the plural time exposures based on the plural sets of the electron beam exposure data to form the mask pattern, then junction portions or overlapping regions of the different mask patterns are double-exposed. The adjacent mask patterns are aligned so that the adjacent mask patterns have overlapping regions to each other. These overlapping regions receive electron beam exposures two times. If a negative resist is used, a light-shielding mask pattern is widen in the junction regions or the overlapping regions. If a positive resist is used, a light-shielding mask pattern is narrowed in the junction regions or the overlapping regions.

FIG. 1A is a fragmentary plane view illustrative of a photo-mask of a negative resist type having received separate exposures of a first mask pattern "A" and a second mask pattern "B". The junction regions or the overlapping regions between the first and second mask patterns "A" and "B" are defined between a continuously broken line and a discontinuously broken line. First, second, third and fourth interconnections 401, 402, 403 and 404 extend across the junction regions or the overlapping regions defined between the continuously broken line and the discontinuously broken line. Across portions of the first, second, third and fourth interconnections 401, 402, 403 and 404 receive double exposures, for which reason the across portions of the first, second, third and fourth interconnections 401, 402, 403 and 404 increase in width due to the photo-mask of the negative type resist.

FIG. 1B is a fragmentary plane view illustrative of a photo-mask of a positive resist type having received separate exposures of a first mask pattern "A" and a second mask pattern "B". The junction regions or the overlapping regions between the first and second mask patterns "A" and "B" are defined between a continuously broken line and a discontinuously broken line. First, second, third and fourth interconnections 401, 402, 403 and 404 extend across the junction regions or the overlapping regions defined between the continuously broken line and the discontinuously broken line. Across portions of the first, second, third and fourth interconnections 401, 402, 403 and 404 receive double exposures, for which reason the across portions of the first, second, third and fourth interconnections 401, 402, 403 and 404 decrease in width due to the photo-mask of the positive type resist.

If the plural times exposures of plural patterns to the single photo-mask are carried out, it is necessary to check whether or not the plural patterns are formed without miss-alignment. For example, it is verified that the patterns formed on the photo-mask are identical with checking-purpose data prepared from the layout data. The double-exposed parts of the interconnections are made wider or narrower than the intended width defined by the checking data. For this reason, it is difficult that the mask patterns over the photo-mask exactly correspond to the checking data.

Even the shapes of the light-shielding mask patterns over the photo-mask are different from the checking data, if the difference is in the acceptable range which is calculated in accordance with the defective regulation in the processes, then the checker verifies that the mask patterns are not defective. Namely, the upper limit of the number of errors is set in accordance with the defective regulation for enabling the checker to verify that the mask patterns are not defective. As described above, the double-exposed parts of the interconnections are wider or narrower, for which reason the double-exposed parts are likely to be beyond the upper limit, and thus the checker verifies that the mask patterns are defective. Once the checker verifies that the mask patterns are defective, then the checker discontinues the current checking operation.

In the above circumstances, it had been required to develop a novel method of checking mask patterns over a photo-mask free from the above problem.

SUMMARY OF THE INVENTION

Accordingly, it is an object of the present invention to provide a novel method of checking mask patterns free from the above problems.

It is a further object of the present invention to provide a novel method of checking mask patterns, wherein the mask patterns have junction regions or overlapping regions receiving double-exposures of electron beams which make widen or narrowed interconnection parts across the junction regions or overlapping regions, and wherein the method avoids a checker from discontinuing current checking operation even if double-exposed interconnection parts of the mask patterns are beyond the acceptable range or the upper limit.

It is a still further object of the present invention to provide a novel method of preparing checking data to be used for checking mask patterns free from the above problems.

It is yet a further object of the present invention to provide a novel method of preparing checking data to be used for checking mask patterns, wherein the mask patterns have junction regions or overlapping regions receiving double-exposures of electron beams which make widen or narrowed interconnection parts across the junction regions or overlapping regions, and wherein the method avoids a checker from discontinuing current checking operation even if double-exposed interconnection parts of the mask patterns are beyond the acceptable range or the upper limit.

It is a still further object of the present invention to provide a novel method of preparing plural sets of electron exposure data to be used for carrying out plural times electron beam exposures to form plural mask patterns free from the above problems.

It is yet a further object of the present invention to provide a novel method of preparing plural sets of electron exposure data to be used for carrying out plural times electron beam exposures to form plural mask patterns, wherein the mask patterns have junction regions or overlapping regions receiving double-exposures of electron beams which make widen or narrowed interconnection parts across the junction regions or overlapping regions, and wherein the method avoids a checker from discontinuing current checking operation even if double-exposed interconnection parts of the mask patterns are beyond the acceptable range or the upper limit.

It is a still further object of the present invention to provide a novel computer program for checking mask patterns free from the above problems.

It is yet a further object of the present invention to provide a novel computer program for checking mask patterns, wherein the mask patterns have junction regions or overlapping regions receiving double-exposures of electron beams which make widen or narrowed interconnection parts across the junction regions or overlapping regions, and wherein the method avoids a checker from discontinuing current checking operation even if double-exposed interconnection parts of the mask patterns are beyond the acceptable range or the upper limit.

The present invention provides a method of checking exposure patterns with reference to checking data, and the exposure patterns having an overlapping region receiving double-exposures of electron beams which vary a width of an interconnection part across the overlapping region, wherein data for a width of the interconnection part across the overlapping region in the checking data are modified to vary the width of the interconnection part.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
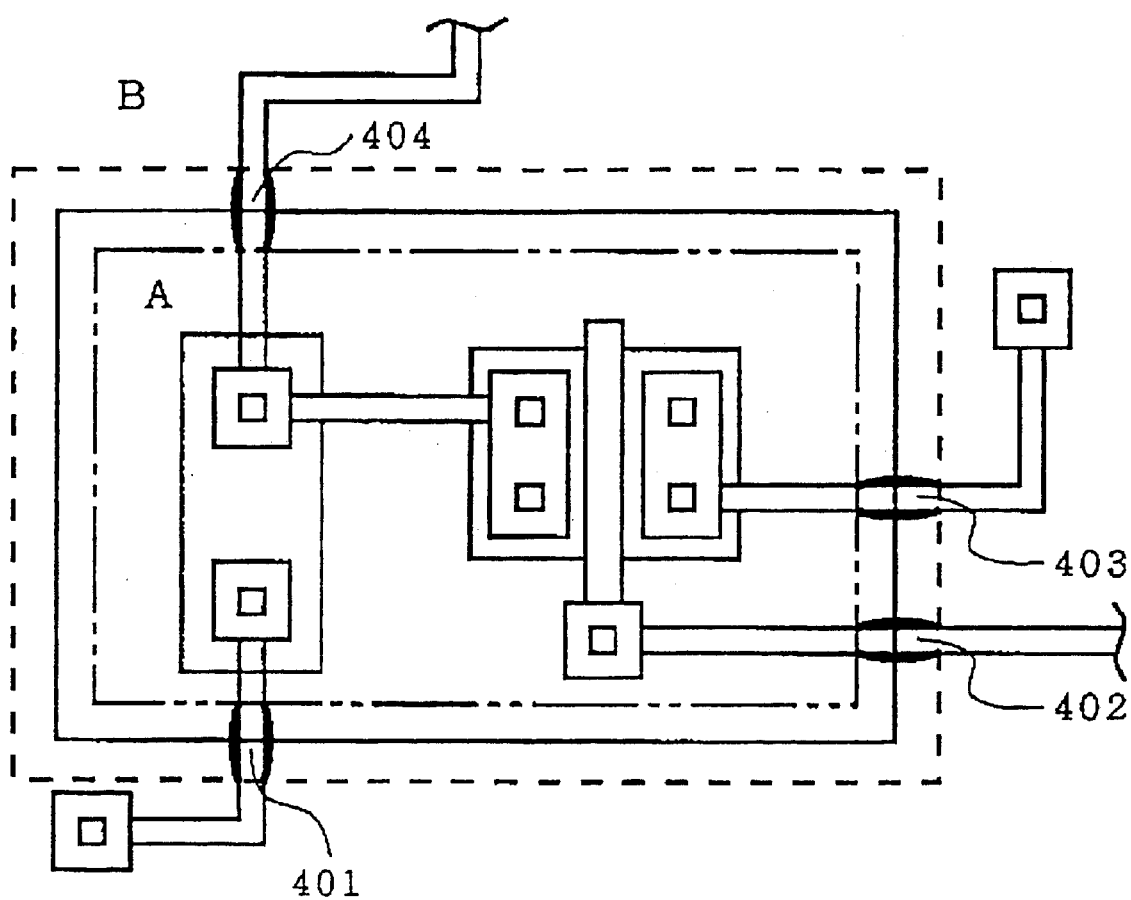
FIG. 1A is a fragmentary plane view illustrative of a photo-mask of a negative resist type having received separate exposures of a first mask pattern "A" and a second mask pattern "B".
Figure 1B:
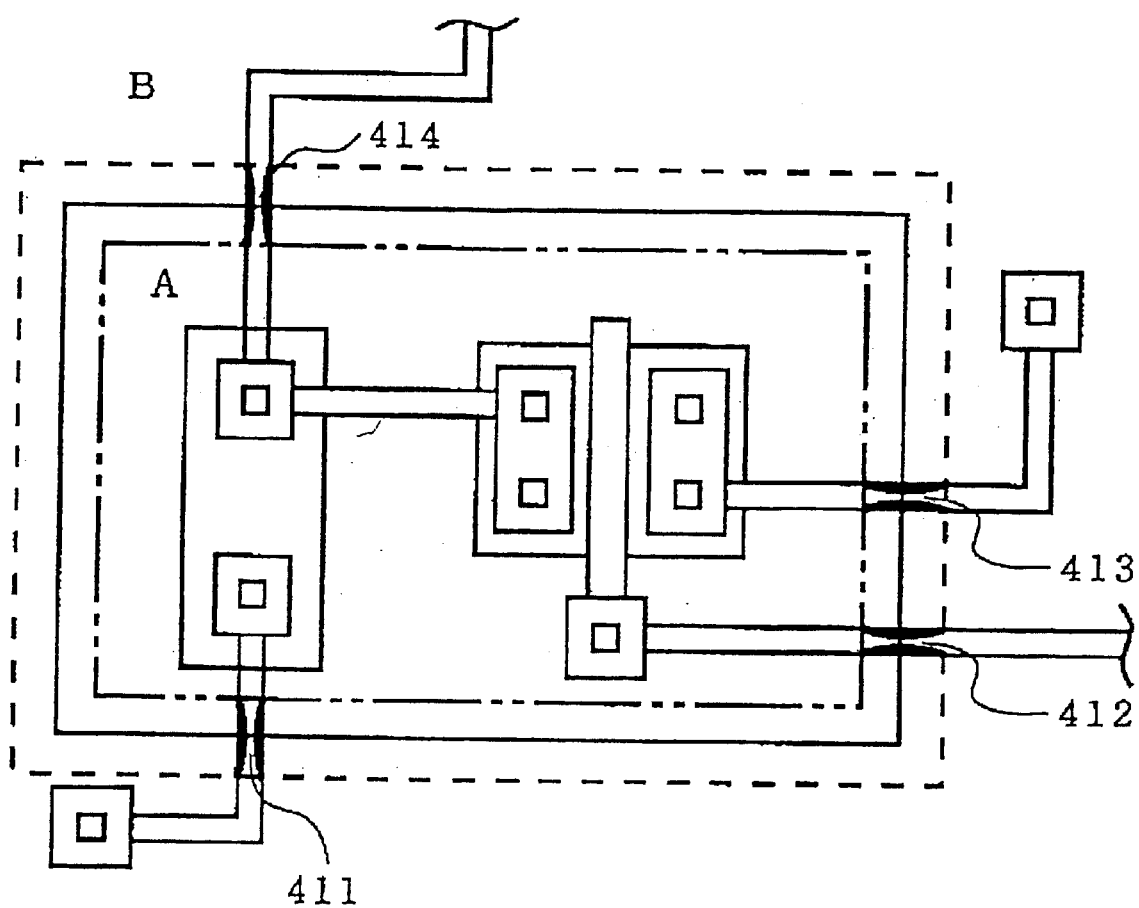
FIG. 1B is a fragmentary plane view illustrative of a photo-mask of a positive resist type having received separate exposures of a first mask pattern "A" and a second mask pattern "B".

The first present invention provides a method of checking exposure patterns with reference to checking data, and the exposure patterns having an overlapping region receiving double-exposures of electron beams which vary a width of an interconnection part across the overlapping region, wherein data for a width of the interconnection part across the overlapping region in the checking data are modified to vary the width of the interconnection part.

It is also preferable that if mask patterns as the exposure patterns are formed over a photo-mask of a negative resist type, then the data for the width of the interconnection part across the overlapping region in the checking data are modified to increase the width of the interconnection part.

It is also preferable that if mask patterns as the exposure patterns are formed over a photo-mask of a positive resist type, then the data for the width of the interconnection part across the overlapping region in the checking data are modified to decrease the width of the interconnection part.

It is also preferable that the interconnection part is defined by an AND-operation of interconnections of the plural exposure patterns.

It is also preferable that an amount of variation in width of the interconnection part of the checking data is calculated from a predetermined defective standard.

It is also preferable that the plural exposure patterns are separately formed by plural electron beam exposures carried out based upon plural sets of electron beam exposure data, and each of the plural sets of the electron beam exposure data is further modified to very a width of the interconnection part across the overlapping region.

It is also preferable that if mask patterns as the exposure patterns are formed over a photo-mask of a negative or positive resist type, then each of the plural sets of the electron beam exposure data is further modified to increase the width of the interconnection part across the overlapping region.

It is also preferable that if mask patterns as the exposure patterns are formed over a photo-mask of a positive resist type, then each of the plural sets of the electron beam exposure data is further modified to decrease the width of the interconnection part across the overlapping region.

It is also preferable that the interconnection part is defined by an AND-operation of interconnections of the plural exposure patterns.

It is also preferable that an amount of variation in width of the interconnection part of the checking data is calculated from a predetermined defective standard.

The second present invention provides a method of checking exposure patterns with reference to checking data, and the exposure patterns having an overlapping region receiving double-exposures of electron beams which vary a width of an interconnection part across the overlapping region, and the plural exposure patterns being separately formed by plural electron beam exposures carried out based upon plural sets of electron beam exposure data, wherein each of the plural sets of the electron beam exposure data is further modified to very a width of the interconnection part across the overlapping region.

It is also preferable that if mask patterns as the exposure patterns are formed over a photo-mask of a negative or positive resist type, then each of the plural sets of the electron beam exposure data is further modified to increase the width of the interconnection part across the overlapping region.

It is also preferable that if mask patterns as the exposure patterns are formed over a photo-mask of a negative or positive resist type, then each of the plural sets of the electron beam exposure data is further modified to decrease the width of the interconnection part across the overlapping region.

It is also preferable that the interconnection part is defined by an AND-operation of interconnections of the plural exposure patterns.

It is also preferable that an amount of variation in width of the interconnection part of the checking data is calculated from a predetermined defective standard.

It is also preferable that data for a width of the interconnection part across the overlapping region in the checking data are further modified to vary the width of the interconnection part.

It is also preferable that if mask patterns as the exposure patterns are formed over a photo-mask of a negative or positive resist type, then the data for the width of the interconnection part across the overlapping region in the checking data are modified to increase the width of the interconnection part.

It is also preferable that if mask patterns as the exposure patterns are formed over a photo-mask of a negative or positive resist type, then the data for the width of the interconnection part across the overlapping region in the checking data are modified to decrease the width of the interconnection part.

It is also preferable that the interconnection part is defined by an AND-operation of interconnections of the plural exposure patterns.

It is also preferable that an amount of variation in width of the interconnection part of the checking data is calculated from a predetermined defective standard.

The third present invention provides a method of preparing checking data to be used for checking exposure patterns, and the exposure patterns having an overlapping region receiving double-exposures of electron beams which vary a width of an interconnection part across the overlapping region, wherein data for a width of the interconnection part across the overlapping region in the checking data are modified to vary the width of the interconnection part.

It is also preferable that if mask patterns as the exposure patterns are formed over a photo-mask of a negative resist type, then the data for the width of the interconnection part across the overlapping region in the checking data are modified to increase the width of the interconnection part.

It is also preferable that if mask patterns as the exposure patterns are formed over a photo-mask of a positive resist type, then the data for the width of the interconnection part across the overlapping region in the checking data are modified to decrease the width of the interconnection part.

It is also preferable that the interconnection part is defined by an AND-operation of interconnections of the plural exposure patterns.

It is also preferable that an amount of variation in width of the interconnection part of the checking data is calculated from a predetermined defective standard.

The fourth present invention provides a method of preparing plural sets of electron beam exposure data, based on which plural electron beam exposures are separately carried out to selectively form plural exposure patterns, and the exposure patterns having an overlapping region receiving double-exposures of electron beams which vary a width of an interconnection part across the overlapping region, and carried out based upon, wherein each of the plural sets of the electron beam exposure data is further modified to very a width of the interconnection part across the overlapping region.

It is also preferable that if mask patterns as the exposure patterns are formed over a photo-mask of a negative resist type, then each of the plural sets of the electron beam exposure data is further modified to increase the width of the interconnection part across the overlapping region.

It is also preferable that if mask patterns as the exposure patterns are formed over a photo-mask of a positive resist type, then each of the plural sets of the electron beam exposure data is further modified to decrease the width of the interconnection part across the overlapping region.

It is also preferable that the interconnection part is defined by an AND-operation of interconnections of the plural exposure patterns.

It is also preferable that an amount of variation in width of the interconnection part of the checking data is calculated from a predetermined defective standard.

The fifth present invention provides a computer program of checking exposure patterns with reference to checking data, and the exposure patterns having an overlapping region receiving double-exposures of electron beams which vary a width of an interconnection part across the overlapping region, wherein data for a width of the interconnection part across the overlapping region in the checking data are modified to vary the width of the interconnection part.

It is also preferable that if mask patterns as the exposure patterns are formed over a photo-mask of a negative or positive resist type, then the data for the width of the interconnection part across the overlapping region in the checking data are modified to increase the width of the interconnection part.

It is also preferable that if mask patterns as the exposure patterns are formed over a photo-mask of a positive resist type, then the data for the width of the interconnection part across the overlapping region in the checking data are modified to decrease the width of the interconnection part.

It is also preferable that the interconnection part is defined by an AND-operation of interconnections of the plural exposure patterns.

It is also preferable that an amount of variation in width of the interconnection part of the checking data is calculated from a predetermined defective standard.

It is also preferable that the plural exposure patterns are separately formed by plural electron beam exposures carried out based upon plural sets of electron beam exposure data, and each of the plural sets of the electron beam exposure data is further modified to very a width of the interconnection part across the overlapping region.

It is also preferable that if mask patterns as the exposure patterns are formed over a photo-mask of a negative resist type, then each of the plural sets of the electron beam exposure data is further modified to increase the width of the interconnection part across the overlapping region.

It is also preferable that if mask patterns as the exposure patterns are formed over a photo-mask of a positive resist type, then each of the plural sets of the electron beam exposure data is further modified to decrease the width of the interconnection part across the overlapping region.

It is also preferable that the interconnection part is defined by an AND-operation of interconnections of the plural exposure patterns.

It is also preferable that an amount of variation in width of the interconnection part of the checking data is calculated from a predetermined defective standard.

The sixth present invention provides a computer program of checking exposure patterns with reference to checking data, and the exposure patterns having an overlapping region receiving double-exposures of electron beams which vary a width of an interconnection part across the overlapping region, and the plural exposure patterns being separately formed by plural electron beam exposures carried out based upon plural sets of electron beam exposure data, wherein each of the plural sets of the electron beam exposure data is further modified to very a width of the interconnection part across the overlapping region.

It is also preferable that if mask patterns as the exposure patterns are formed over a photo-mask of a negative or positive resist type, then each of the plural sets of the electron beam exposure data is further modified to increase the width of the interconnection part across the overlapping region.

It is also preferable that if mask patterns as the exposure patterns are formed over a photo-mask of a negative or positive resist type, then each of the plural sets of the electron beam exposure data is further modified to decrease the width of the interconnection part across the overlapping region.

It is also preferable that the interconnection part is defined by an AND-operation of interconnections of the plural exposure patterns.

It is also preferable that an amount of variation in width of the interconnection part of the checking data is calculated from a predetermined defective standard.

It is also preferable that data for a width of the interconnection part across the overlapping region in the checking data are further modified to vary the width of the interconnection part.

It is also preferable that if the exposure patterns are formed over a photo-mask is of a negative resist type, then the data for the width of the interconnection part across the overlapping region in the checking data are modified to increase the width of the interconnection part.

It is also preferable that if mask patterns as the exposure patterns are formed over a photo-mask of a positive resist type, then the data for the width of the interconnection part across the overlapping region in the checking data are modified to decrease the width of the interconnection part.

It is also preferable that the interconnection part is defined by an AND-operation of interconnections of the plural exposure patterns.

It is also preferable that an amount of variation in width of the interconnection part of the checking data is calculated from a predetermined defective standard.

The exposure patterns have junction regions or overlapping regions receiving double-exposures of electron beams which make widen or narrowed interconnection parts across the junction regions or overlapping regions. However, the present inventions modify the checking data and/or the electron beam exposure data to very the width of the double-exposed interconnection parts in the overlapping regions of the different exposure patterns in order to avoid a checker from discontinuing current checking operation even if the double-exposed interconnection parts of the exposure patterns are beyond the acceptable range or the upper limit. This shortens the checking time. This also makes it unnecessary to additionally investigate the reason why the checker discontinued the current checking operation.

If the prepared layout data include both first type layout data for traditional process and second type layout data for advanced process, then in order to effectively utilize the first type layout data for traditional process, the exposure data are also divided into first type electron beam exposure data for the traditional process and second type electron beam exposure data for the advanced process, so that plural time exposure processes are carried out for the single photo-mask. The above present inventions are also effective and applicable to this case.

If it is required to convert data of large capacity and high integration for a single chip into the electron beam exposure data, or if it is required to synthesize those data, it might be difficult to process the data due to the limited throughput and the limited capacity of the storage medium. In this case, it is effective that those large capacity and high integration data are divided into plural modules before each module is then converted into the electron beam exposure data. Plural sets of the electron beam exposure data are used for carrying out plural time exposure processes for the single photo-mask. The above present inventions are also effective and applicable to this case.

If it is required to convert data of large capacity and high integration for a single chip into the electron beam exposure data, or if it is required to synthesize those data, it might be difficult to process the data due to the limited throughput and the limited capacity of the storage medium. In this case, it is effective that an entire region of the single chip is divided into plural sub-regions, and data of each of the sub-regions is separately converted into the electron beam exposure data. Plural sets of the electron beam exposure data are used for carrying out plural time exposure processes for the single photo-mask. The above present inventions are also effective and applicable to this case.

The above present inventions are also effective and applicable to when plural exposure patterns are formed directly over a wafer without using a photo-mask.

PREFERRED EMBODIMENT

First Embodiment

Figure 2A:
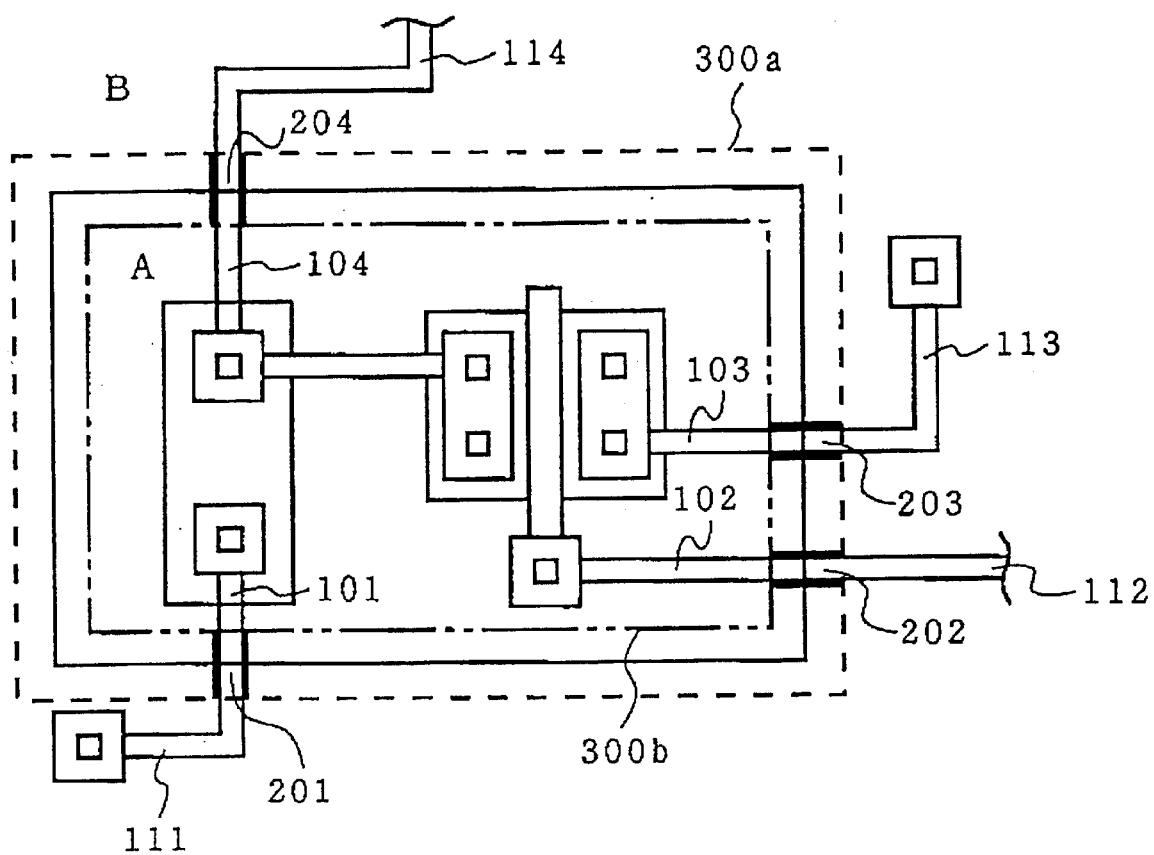
FIG. 2A is a fragmentary plane view illustrative of a photo-mask of a negative resist type having received separate exposures of a first mask pattern "A" and a second mask pattern "B" in a first embodiment in accordance with the present invention.

A first embodiment according to the present invention will be described in detail with reference to the drawings. FIG. 2A is a fragmentary plane view illustrative of a photo-mask of a negative resist type having received separate exposures of a first mask pattern "A" and a second mask pattern "B". The junction regions or the overlapping regions between the first and second mask patterns "A" and "B" are defined between a continuously broken line representing a first boundary 300a of the first mask pattern "A" and a discontinuously broken line representing a second boundary 300b of the second mask pattern "B". The junction regions or the overlapping regions have a width of 5 micrometers which is defined to be a distance between the first and second boundaries 300a and 300b. First, second, third and fourth interconnections 101, 102, 103 and 104 extend across the junction regions or the overlapping regions defined between the continuously broken line and the discontinuously broken line. Overlapping portions 201, 202, 203 and 204 of the first, second, third and fourth interconnections 101, 102, 103 and 104 receive double exposures, for which reason the overlapping portions 201, 202, 203 and 204 of the first, second, third and fourth interconnections 101, 102, 103 and 104 increase in width due to the photo-mask of the negative type resist.

Figure 2B:
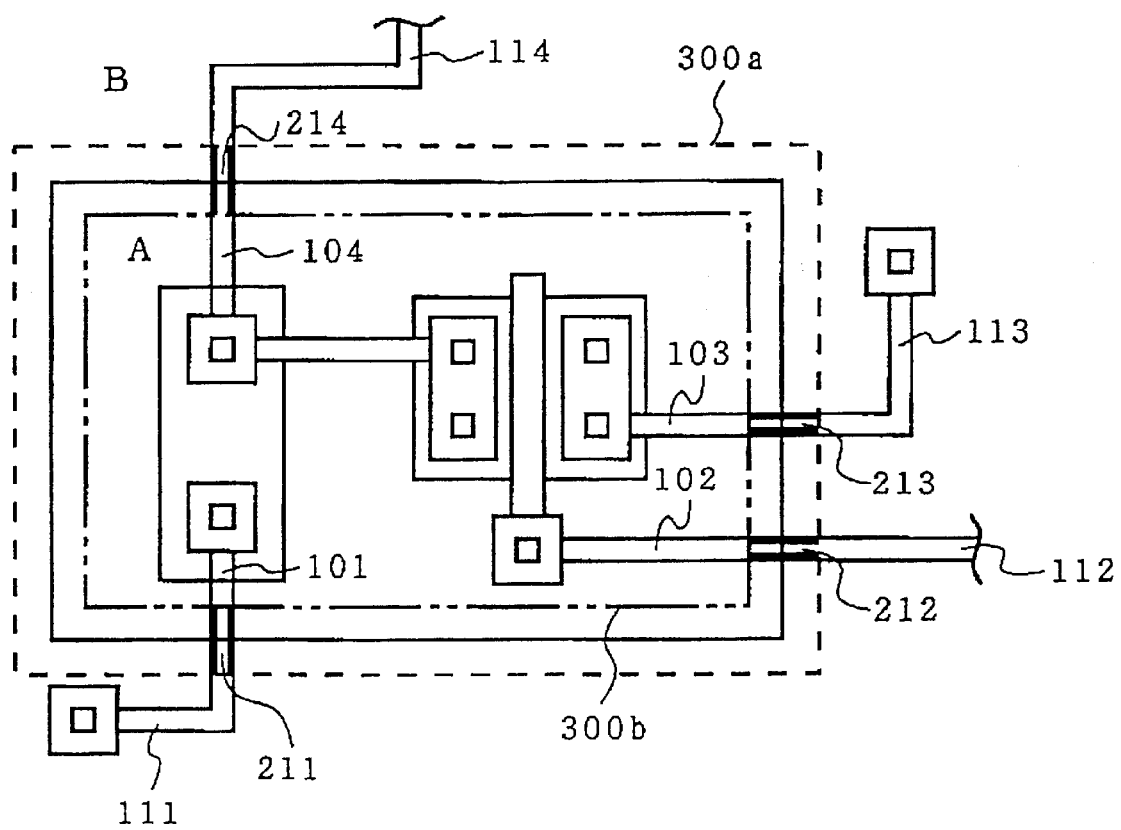
FIG. 2B is a fragmentary plane view illustrative of a photo-mask of a positive resist type having received separate exposures of a first mask pattern "A" and a second mask pattern "B" in a first embodiment in accordance with the present invention.

FIG. 2B is a fragmentary plane view illustrative of a photo-mask of a positive resist type having received separate exposures of a first mask pattern "A" and a second mask pattern "B". The junction regions or the overlapping regions between the first and second mask patterns "A" and "B" are defined between a continuously broken line representing a first boundary 300a of the first mask pattern "A" and a discontinuously broken line representing a second boundary 300b of the second mask pattern "B". The junction regions or the overlapping regions have a width of 5 micrometers which is defined to be a distance between the first and second boundaries 300a and 300b. First, second, third and fourth interconnections 111, 112, 113 and 114 extend across the junction regions or the overlapping regions defined between the continuously broken line 300a and the discontinuously broken line 300b. Overlapping portions 201, 202, 203 and 204 of the first, second, third and fourth interconnections 111, 112, 113 and 114 receive double exposures, for which reason the overlapping portions 201, 202, 203 and 204 of the first, second, third and fourth interconnections 111, 112, 113 and 114 decrease in width due to the photo-mask of the positive type resist.

Figure 3A:
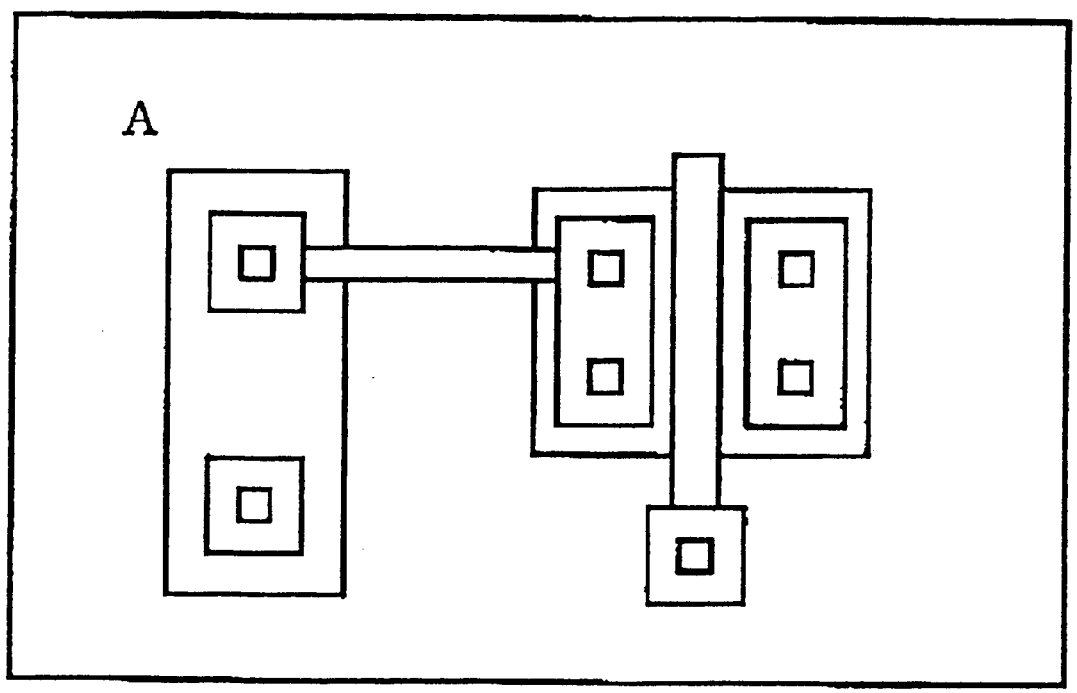
FIG. 3A is a plane view illustrative of a first mask pattern "A" to be used for forming mask patterns over a photo-mask shown in FIGS. 2A and 2B.
Figure 3B:
FIG. 3B is a plane view illustrative of a second mask pattern "B" to be used for forming mask patterns over a photo-mask shown in FIGS. 2A and 2B.
Figure 3B:
Figure 3B:
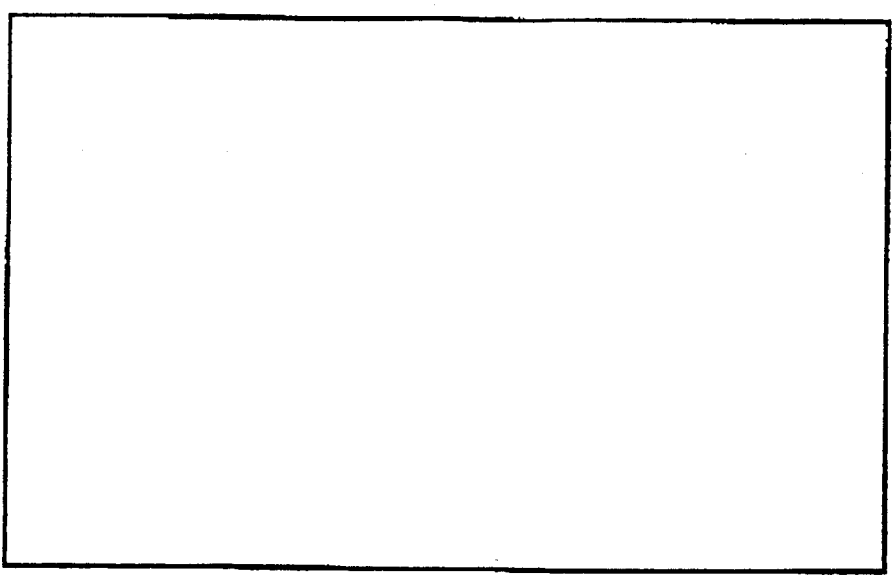
Figure 3B:
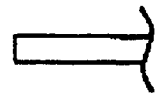
Figure 3B:

FIG. 3A is a plane view illustrative of a first mask pattern "A" to be used for forming mask patterns over a photo-mask shown in FIGS. 2A and 2B. FIG. 3B is a plane view illustrative of a second mask pattern "B" to be used for forming mask patterns over a photo-mask shown in FIGS. 2A and 2B.

With reference to FIG. 2A, the photo-mask is of the negative type resist. In this case, the overlapping portions 201, 202, 203 and 204 of the first, second, third and fourth interconnections 101, 102, 103 and 104 of the first mask pattern "A" and the first, second, third and fourth interconnections 111, 112, 113 and 114 of the second mask pattern "B" are defined by the AND-operations of the first, second, third and fourth interconnections 101, 102, 103 and 104 of the first mask pattern "A" and the first, second, third and fourth interconnections 111, 112, 113 and 114 of the second mask pattern "B". The overlapping portions 201, 202, 203 and 204 are double-exposed or receive the two times electron beam exposures for separately forming the first and second mask patterns "A" and "B". The first and second mask patterns "A" and "B" over the single photo-mask are checked with reference to the checking data, which include data representing widths of the double-exposed overlapping portions 201, 202, 203 and 204. The data representing widths of the double-exposed overlapping portions 201, 202, 203 and 204 are modified to increase the widths, for example, one side increment is 0.3 micrometers and a total increment is 0.6 micrometers. The value of increment, for example, 0.6 micrometers is calculated form the defective regulation and an increased value of the with of the double-exposed overlapping portions due to the double exposures. An averaged increasing value of the with of the double-exposed overlapping portions due to the double exposures is 0.4 micrometers. The defective regulations have already been decided in accordance with each process. An acceptable range or margin for checking the mask patterns is decided based upon the defective regulations. In this embodiment, the defective regulation is set at 0.6 micrometers. The acceptable margin from the averaged value of the increment in with of the double-exposed overlapping portions is decided to be ⅓ of the defective regulation of 0.6 micrometers, for example, +0.2 micrometers and −0.2 micrometers. If the averaged value of the increment in with of the double-exposed overlapping portions is 0.4 micrometers, then the acceptable range for increment in the width of the double-exposed overlapping portions is in the range of 0.2 micrometers to 0.6 micrometers. If the averaged value of the increment in with of the double-exposed overlapping portions is 0.2 micrometers, then the acceptable range for increment in the width of the double-exposed overlapping portions is in the range of 0 micrometer to 0.4 micrometers. In this case, it is not necessarily to modify the checking data. The averaged value of the actual increment in with of the double-exposed overlapping portions depends upon the manufacturing conditions of the individual electron beam exposure systems. In this embodiment, widely used EMBES-4500 was used which is commercially available from ETEC Corporation. A first set of the electron bean exposure data for the first mask pattern "A" and a second set of the electron bean exposure data for the second mask pattern "B" are not modified. Even the double-exposed overlapping portions increase in width, the checker is allowed to continue the current checking operation to the final.

With reference to FIG. 2B, the photo-mask is of the positive type resist. In this case, the overlapping portions 201, 202, 203 and 204 of the first, second, third and fourth interconnections 101, 102, 103 and 104 of the first mask pattern "A" and the first, second, third and fourth interconnections 111, 112, 113 and 114 of the second mask pattern "B" are defined by the AND-operations of the first, second, third and fourth interconnections 101, 102, 103 and 104 of the first mask pattern "A" and the first, second, third and fourth interconnections 111, 112, 113 and 114 of the second mask pattern "B". The overlapping portions 201, 202, 203 and 204 are double-exposed or receive the two times electron beam exposures for separately forming the first and second mask patterns "A" and "B". The first and second mask patterns "A" and "B" over the single photo-mask are checked with reference to the checking data, which include data representing widths of the double-exposed overlapping portions 201, 202, 203 and 204. The data representing widths of the double-exposed overlapping portions 201, 202, 203 and 204 are modified to decrease the widths, for example, one side decrement is 0.3 micrometers and a total decrement is 0.6 micrometers. The value of decrement, for example, 0.6 micrometers is calculated form the defective regulation and a decreased value of the with of the double-exposed overlapping portions due to the double exposures. An averaged decreasing value of the with of the double-exposed overlapping portions due to the double exposures is 0.4 micrometers. The defective regulations have already been decided in accordance with each process. An acceptable range or margin for checking the mask patterns is decided based upon the defective regulations. In this embodiment, the defective regulation is set at 0.6 micrometers. The acceptable margin from the averaged value of the decrement in with of the double-exposed overlapping portions is decided to be ⅓ of the defective regulation of 0.6 micrometers, for example, +0.2 micrometers and −0.2 micrometers. If the averaged value of the decrement in with of the double-exposed overlapping portions is 0.4 micrometers, then the acceptable range for decrement in the width of the double-exposed overlapping portions is in the range of 0.2 micrometers to 0.6 micrometers. If the averaged value of the decrement in with of the double-exposed overlapping portions is 0.2 micrometers, then the acceptable range for decrement in the width of the double-exposed overlapping portions is in the range of 0 micrometer to 0.4 micrometers. In this case, it is not necessarily to modify the checking data. The averaged value of the actual decrement in with of the double-exposed overlapping portions depends upon the manufacturing conditions of the individual electron beam exposure systems. In this embodiment, widely used EMBES-4500 was used which is commercially available from ETEC Corporation. A first set of the electron bean exposure data for the first mask pattern "A" and a second set of the electron bean exposure data for the second mask pattern "B" are not modified. Even the double-exposed overlapping portions decrease in width, the checker is allowed to continue the current checking operation to the final.

In this embodiment, the shrinkage rate is fixed in the first and second electron beam exposures for forming the first and second mask patterns. It is also possible that the shrinkage rate is different between the first and second electron beam exposures for forming the first and second mask patterns.

The exposure patterns have junction regions or overlapping regions receiving double-exposures of electron beams which make widen or narrowed interconnection parts across the junction regions or overlapping regions. However, the present inventions modify the checking data and/or the electron beam exposure data to very the width of the double-exposed interconnection parts in the overlapping regions of the different exposure patterns in order to avoid a checker from discontinuing current checking operation even if the double-exposed interconnection parts of the exposure patterns are beyond the acceptable range or the upper limit. This shortens the checking time. This also makes it unnecessary to additionally investigate the reason why the checker discontinued the current checking operation.

If the prepared layout data include both first type layout data for traditional process and second type layout data for advanced process, then in order to effectively utilize the first type layout data for traditional process, the exposure data are also divided into first type electron beam exposure data for the traditional process and second type electron beam exposure data for the advanced process, so that plural time exposure processes are carried out for the single photo-mask. The above present inventions are also effective and applicable to this case.

If it is required to convert data of large capacity and high integration for a single chip into the electron beam exposure data, or if it is required to synthesize those data, it might be difficult to process the data due to the limited throughput and the limited capacity of the storage medium. In this case, it is effective that those large capacity and high integration data are divided into plural modules before each module is then converted into the electron beam exposure data. Plural sets of the electron beam exposure data are used for carrying out plural time exposure processes for the single photo-mask. The above present inventions are also effective and applicable to this case.

If it is required to convert data of large capacity and high integration for a single chip into the electron beam exposure data, or if it is required to synthesize those data, it might be difficult to process the data due to the limited throughput and the limited capacity of the storage medium. In this case, it is effective that an entire region of the single chip is divided into plural sub-regions, and data of each of the sub-regions is separately converted into the electron beam exposure data. Plural sets of the electron beam exposure data are used for carrying out plural time exposure processes for the single photo-mask. The above present inventions are also effective and applicable to this case.

The above present inventions are also effective and applicable to when plural exposure patterns are formed directly over a wafer without using a photo-mask.

Second Embodiment

A second embodiment according to the present invention will be described in detail with reference to the drawings. In this embodiment, not only the checking data but also the electron beam exposure data are modified to vary the width of the double-exposed overlapping portions of the interconnections of the first and second mask patterns "A" and "B". For example, the first set of the electron beam exposure data represents the first mask pattern "A", whilst the second set of the electron beam exposure data represents the first mask pattern "B". The first set of the electron beam exposure data is prepared from first base data, whilst the second set of the electron beam exposure data is prepared from second base data. In this embodiment, the first and second base data are modified. The first set of the electron beam exposure data representing the first mask pattern "A" is prepared from the modified first base data. The second set of the electron beam exposure data representing the second mask pattern "B" is prepared from the modified second base data. The checking data are also prepared from the modified first and second base data.

Figure 4A:
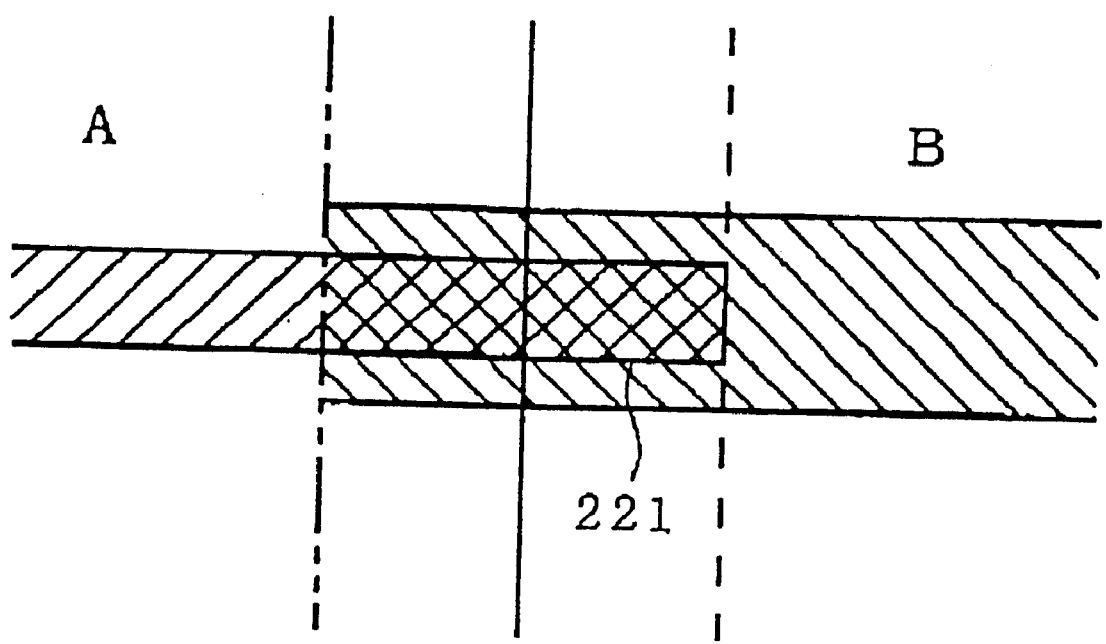
FIG. 4A is a fragmentary plane view illustrative of overlapping portions of a first interconnection of a first mask pattern "A" and a second interconnection of a second mask pattern "B" in a second embodiment in accordance with the present invention.

FIG. 4A is a fragmentary plane view illustrative of overlapping portions of a first interconnection of a first mask pattern "A" and a second interconnection of a second mask pattern "B", wherein the first interconnection of the first mask pattern "A" is decreased in width, whilst the second interconnection of the second mask pattern "B" remains unchanged in width, and the first and second interconnections overlap by 5 micrometers. The first interconnection 221 is decreased in width by 0.6 micrometers in both cases that the photo-mask is of the negative type resist and that the photo-mask is of the positive type resist. Namely, in one side, 0.3 micrometers decrease in width is made. The decrement in the width of the first interconnection is calculated from the defective regulation and the averaged value of the decrement in width of the interconnection due to the double exposure in the same manner as described in the first embodiment. Even in this embodiment, the entire part of the first interconnection is decreased in width, it is possible that only the overlapping portion of the first interconnection is decreased in width. It is also possible that in place of the first interconnection, the entire part of the second interconnection is decreased in width. It is also possible that only the overlapping portion of the second interconnection is decreased in width. It is also possible that entire parts of both the first and second interconnections are decreased in width. It is also possible that the overlapping portions of both the first and second interconnections are decreased in width.

Figure 4B:
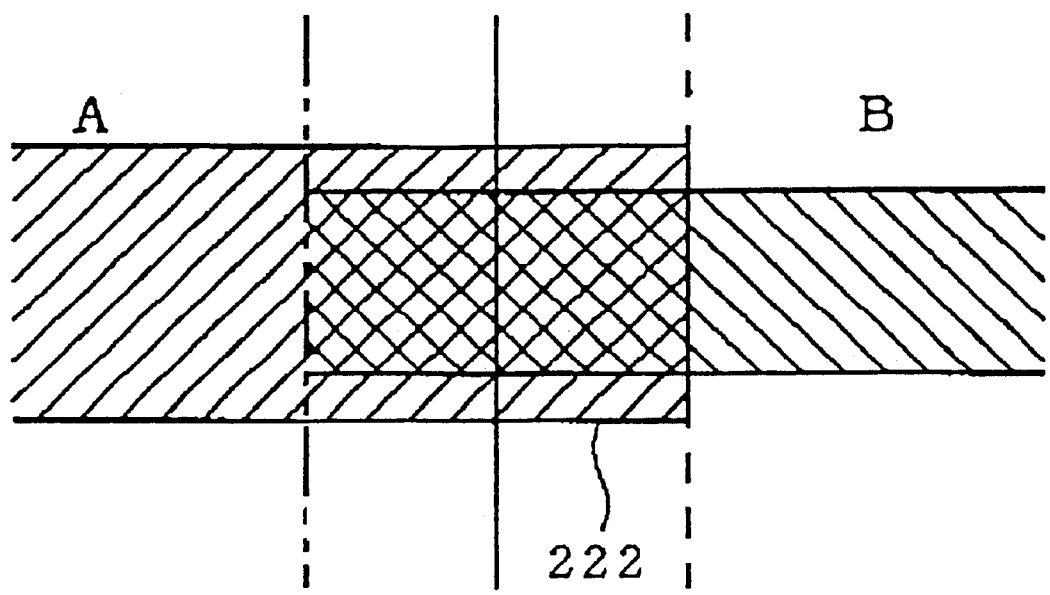
FIG. 4B is a fragmentary plane view illustrative of overlapping portions of a first interconnection of a first mask pattern "A" and a second interconnection of a second mask pattern "B" in a second embodiment in accordance with the present invention.

FIG. 4B is a fragmentary plane view illustrative of overlapping portions of a first interconnection of a first mask pattern "A" and a second interconnection of a second mask pattern "B", wherein the first interconnection of the first mask pattern "A" is increased in width, whilst the second interconnection of the second mask pattern "B" remains unchanged in width, and the first and second interconnections overlap by 5 micrometers. The first interconnection 222 is increased in width by 0.6 micrometers in both cases that the photo-mask is of the negative type resist and that the photo-mask is of the positive type resist. Namely, in one side, 0.3 micrometers increase in width is made. The increment in the width of the first interconnection is calculated from the defective regulation and the averaged value of the increment in width of the interconnection due to the double exposure in the same manner as described in the first embodiment. Even in this embodiment, the entire part of the first interconnection is increased in width, it is possible that only the overlapping portion of the first interconnection is increased in width. It is also possible that in place of the first interconnection, the entire part of the second interconnection is increased in width. It is also possible that only the overlapping portion of the second interconnection is increased in width. It is also possible that entire parts of both the first and second interconnections are increased in width. It is also possible that the overlapping portions of both the first and second interconnections are increased in width.

Figure 4C:
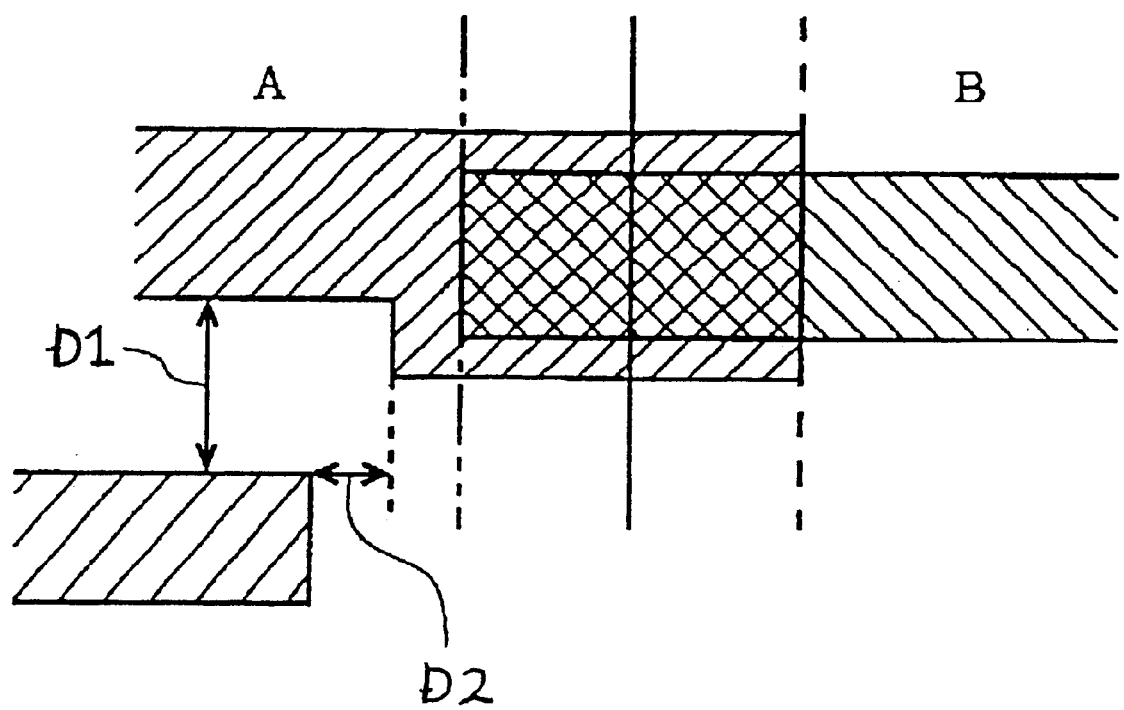
FIG. 4C is a fragmentary plane view illustrative of overlapping portions of a first interconnection of a first mask pattern "A" and a second interconnection of a second mask pattern "B" in a second embodiment in accordance with the present invention.

FIG. 4C is a fragmentary plane view illustrative of overlapping portions of a first interconnection of a first mask pattern "A" and a second interconnection of a second mask pattern "B", wherein the first interconnection of the first mask pattern "A" is entirely increased in width of a first side and partially increased in width of a second side, whilst the second interconnection of the second mask pattern "B" remains unchanged in width, and the first and second interconnections overlap by 5 micrometers. The first interconnection is increased in width by 0.6 micrometers in both cases that the photo-mask is of the negative type resist and that the photo-mask is of the positive type resist. Namely, in the first side, 0.3 micrometers increase in width is made to the entire region of the first interconnection, whilst in the second side, 0.3 micrometers increase in width is partially made to the overlapping region and adjacent region thereto of the first interconnection, in order to keep or ensure a first minimum distance "D1" of acceptable range from an adjacent interconnection pattern in a width direction and a second minimum distance "D2" of acceptable range from the adjacent interconnection pattern in a longitudinal direction perpendicular to the width direction. The increment in the width of the first interconnection is calculated from the defective regulation and the averaged value of the increment in width of the interconnection due to the double exposure in the same manner as described in the first embodiment.

In this embodiment, the shrinkage rate is fixed in the first and second electron beam exposures for forming the first and second mask patterns. It is also possible that the shrinkage rate is different between the first and second electron beam exposures for forming the first and second mask patterns.

The exposure patterns have junction regions or overlapping regions receiving double-exposures of electron beams which make widen or narrowed interconnection parts across the junction regions or overlapping regions. However, the present inventions modify the checking data and/or the electron beam exposure data to very the width of the double-exposed interconnection parts in the overlapping regions of the different exposure patterns in order to avoid a checker from discontinuing current checking operation even if the double-exposed interconnection parts of the exposure patterns are beyond the acceptable range or the upper limit. This shortens the checking time. This also makes it unnecessary to additionally investigate the reason why the checker discontinued the current checking operation.

If the prepared layout data include both first type layout data for traditional process and second type layout data for advanced process, then in order to effectively utilize the first type layout data for traditional process, the exposure data are also divided into first type electron beam exposure data for the traditional process and second type electron beam exposure data for the advanced process, so that plural time exposure processes are carried out for the single photo-mask. The above present inventions are also effective and applicable to this case.

If it is required to convert data of large capacity and high integration for a single chip into the electron beam exposure data, or if it is required to synthesize those data, it might be difficult to process the data due to the limited throughput and the limited capacity of the storage medium. In this case, it is effective that those large capacity and high integration data are divided into plural modules before each module is then converted into the electron beam exposure data. Plural sets of the electron beam exposure data are used for carrying out plural time exposure processes for the single photo-mask. The above present inventions are also effective and applicable to this case.

If it is required to convert data of large capacity and high integration for a single chip into the electron beam exposure data, or if it is required to synthesize those data, it might be difficult to process the data due to the limited throughput and the limited capacity of the storage medium. In this case, it is effective that an entire region of the single chip is divided into plural sub-regions, and data of each of the sub-regions is separately converted into the electron beam exposure data. Plural sets of the electron beam exposure data are used for carrying out plural time exposure processes for the single photo-mask. The above present inventions are also effective and applicable to this case.

The above present inventions are also effective and applicable to when plural exposure patterns are formed directly over a wafer without using a photo-mask.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of checking exposure patterns with reference to checking data, and the exposure patterns having an overlapping region receiving double-exposures of electron beams which vary a width of an interconnection part across the overlapping region, wherein data for a width of the interconnection part across the overlapping region in the checking data are modified to vary the width of the interconnection part.

2. The method as claimed in claim 1, wherein if mask patterns as the exposure patterns are formed over a photomask of a negative resist type, then the data for the width of the interconnection part across the overlapping region in the checking data are modified to increase the width of the interconnection part.

3. The method as claimed in claim 1, wherein if mask patterns as the exposure patterns are formed over a photomask of a positive resist type, then the data for the width of the interconnection part across the overlapping region in the checking data are modified to decrease the width of the interconnection part.

4. The method as claimed in claim 1, wherein the interconnection part is defined by an AND-operation of interconnections of the plural exposure patterns.

5. The method as claimed in claim 1, wherein an amount of variation in width of the interconnection part of the checking data is calculated from a predetermined defective standard.

6. The method as claimed in claim 1, wherein the plural exposure patterns are separately formed by plural electron beam exposures carried out based upon plural sets of electron beam exposure data, and each of the plural sets of the electron beam exposure data is further modified to very a width of the interconnection part across the overlapping region.

7. The method as claimed in claim 6, wherein if mask patterns as the exposure patterns are formed over a photomask of a negative or positive resist type, then each of the plural sets of the electron beam exposure data is further modified to increase the width of the interconnection part across the overlapping region.

8. The method as claimed in claim 6, wherein if mask patterns as the exposure patterns are formed over a photomask of a negative or positive resist type, then each of the plural sets of the electron beam exposure data is further modified to decrease the width of the interconnection part across the overlapping region.

9. The method as claimed in claim 6, wherein the interconnection part is defined by an AND-operation of interconnections of the plural exposure patterns.

10. The method as claimed in claim 6, wherein an amount of variation in width of the interconnection part of the checking data is calculated from a predetermined defective standard.

11. A method of checking exposure patterns with reference to checking data, and the exposure patterns having an overlapping region receiving double-exposures of electron beams which vary a width of an interconnection part across the overlapping region, and the plural exposure patterns being separately formed by plural electron beam exposures carried out based upon plural sets of electron beam exposure data, wherein each of the plural sets of the electron beam exposure data is further modified to very a width of the interconnection part across the overlapping region.

12. The method as claimed in claim 11, wherein if mask patterns as the exposure patterns are formed over a photomask of a negative or positive resist type, then each of the plural sets of the electron beam exposure data is further modified to increase the width of the interconnection part across the overlapping region.

13. The method as claimed in claim 11, wherein if mask patterns as the exposure patterns are formed over a photomask of a negative or positive resist type, then each of the plural sets of the electron beam exposure data is further modified to decrease the width of the interconnection part across the overlapping region.

14. The method as claimed in claim 11, wherein the interconnection part is defined by an AND-operation of interconnections of the plural exposure patterns.

15. The method as claimed in claim 11, wherein an amount of variation in width of the interconnection part of the checking data is calculated from a predetermined defective standard.

16. The method as claimed in claim 11, wherein data for a width of the interconnection part across the overlapping region in the checking data are further modified to vary the width of the interconnection part.

17. The method as claimed in claim 16, wherein if mask patterns as the exposure patterns are formed over a photomask of a negative resist type, then the data for the width of the interconnection part across the overlapping region in the checking data are modified to increase the width of the interconnection part.

18. The method as claimed in claim 16, wherein if mask patterns as the exposure patterns are formed over a photomask of a positive resist type, then the data for the width of the interconnection part across the overlapping region in the checking data are modified to decrease the width of the interconnection part.

19. The method as claimed in claim 16, wherein the interconnection part is defined by an AND-operation of interconnections of the plural exposure patterns.

20. The method as claimed in claim 16, wherein an amount of variation in width of the interconnection part of the checking data is calculated from a predetermined defective standard.

21. A method of preparing checking data to be used for checking exposure patterns, and the exposure patterns having an overlapping region receiving double-exposures of electron beams which vary a width of an interconnection part across the overlapping region, wherein data for a width of the interconnection part across the overlapping region in the checking data are modified to vary the width of the interconnection part.

22. The method as claimed in claim 21, wherein if mask patterns as the exposure patterns are formed over a photomask of a negative resist type, then the data for the width of the interconnection part across the overlapping region in the checking data are modified to increase the width of the interconnection part.

23. The method as claimed in claim 21, wherein if mask patterns as the exposure patterns are formed over a photomask of a positive resist type, then the data for the width of the interconnection part across the overlapping region in the checking data are modified to decrease the width of the interconnection part.

24. The method as claimed in claim 21, wherein the interconnection part is defined by an AND-operation of interconnections of the plural exposure patterns.

25. The method as claimed in claim 21, wherein an amount of variation in width of the interconnection part of the checking data is calculated from a predetermined defective standard.

26. A method of preparing plural sets of electron beam exposure data, based on which plural electron beam exposures are separately carried out to selectively form plural exposure patterns, and the exposure patterns having an overlapping region receiving double-exposures of electron beams which vary a width of an interconnection part across the overlapping region, and carried out based upon,
wherein each of the plural sets of the electron beam exposure data is further modified to very a width of the interconnection part across the overlapping region.

27. The method as claimed in claim 26, wherein if mask patterns as the exposure patterns are formed over a photo-mask of a negative or positive resist type, then each of the plural sets of the electron beam exposure data is further modified to increase the width of the interconnection part across the overlapping region.

28. The method as claimed in claim 26, wherein if mask patterns as the exposure patterns are formed over a photo-mask of a negative or positive resist type, then each of the plural sets of the electron beam exposure data is further modified to decrease the width of the interconnection part across the overlapping region.

29. The method as claimed in claim 26, wherein the interconnection part is defined by an AND-operation of interconnections of the plural exposure patterns.

30. The method as claimed in claim 26, wherein an amount of variation in width of the interconnection part of the checking data is calculated from a predetermined defective standard.

31. A computer program of checking exposure patterns with reference to checking data, and the exposure patterns having an overlapping region receiving double-exposures of electron beams which vary a width of an interconnection part across the overlapping region,
wherein data for a width of the interconnection part across the overlapping region in the checking data are modified to vary the width of the interconnection part.

32. The computer program as claimed in claim 31, wherein if mask patterns as the exposure patterns are formed over a photo-mask of a negative resist type, then the data for the width of the interconnection part across the overlapping region in the checking data are modified to increase the width of the interconnection part.

33. The computer program as claimed in claim 31, wherein if mask patterns as the exposure patterns are formed over a photo-mask of a positive resist type, then the data for the width of the interconnection part across the overlapping region in the checking data are modified to decrease the width of the interconnection part.

34. The computer program as claimed in claim 31, wherein the interconnection part is defined by an AND-operation of interconnections of the plural exposure patterns.

35. The computer program as claimed in claim 31, wherein an amount of variation in width of the interconnection part of the checking data is calculated from a predetermined defective standard.

36. The computer program as claimed in claim 31, wherein the plural exposure patterns are separately formed by plural electron beam exposures carried out based upon plural sets of electron beam exposure data, and each of the plural sets of the electron beam exposure data is further modified to very a width of the interconnection part across the overlapping region.

37. The computer program as claimed in claim 36, wherein if mask patterns as the exposure patterns are formed over a photo-mask of a negative or positive resist type, then each of the plural sets of the electron beam exposure data is further modified to increase the width of the interconnection part across the overlapping region.

38. The computer program as claimed in claim 36, wherein if mask patterns as the exposure patterns are formed over a photo-mask of a negative or positive resist type, then each of the plural sets of the electron beam exposure data is further modified to decrease the width of the interconnection part across the overlapping region.

39. The computer program as claimed in claim 36, wherein the interconnection part is defined by an AND-operation of interconnections of the plural exposure patterns.

40. The computer program as claimed in claim 36, wherein an amount of variation in width of the interconnection part of the checking data is calculated from a predetermined defective standard.

41. A computer program of checking exposure patterns with reference to checking data, and the exposure patterns having an overlapping region receiving double-exposures of electron beams which vary a width of an interconnection part across the overlapping region, and the plural exposure patterns being separately formed by plural electron beam exposures carried out based upon plural sets of electron beam exposure data,
wherein each of the plural sets of the electron beam exposure data is further modified to very a width of the interconnection part across the overlapping region.

42. The computer program as claimed in claim 41, wherein if mask patterns as the exposure patterns are formed over a photo-mask of a negative or positive resist type, then each of the plural sets of the electron beam exposure data is further modified to increase the width of the interconnection part across the overlapping region.

43. The computer program as claimed in claim 41, wherein if mask patterns as the exposure patterns are formed over a photo-mask of a negative or positive resist type, then each of the plural sets of the electron beam exposure data is further modified to decrease the width of the interconnection part across the overlapping region.

44. The computer program as claimed in claim 41, wherein the interconnection part is defined by an AND-operation of interconnections of the plural exposure patterns.

45. The computer program as claimed in claim 41, wherein an amount of variation in width of the interconnection part of the checking data is calculated from a predetermined defective standard.

46. The computer program as claimed in claim 41, wherein data for a width of the interconnection part across the overlapping region in the checking data are further modified to vary the width of the interconnection part.

47. The computer program as claimed in claim 46, wherein if mask patterns as the exposure patterns are formed over a photo-mask of a negative resist type, then the data for the width of the interconnection part across the overlapping region in the checking data are modified to increase the width of the interconnection part.

48. The computer program as claimed in claim 46, wherein if mask patterns as the exposure patterns are formed over a photo-mask of a positive resist type, then the data for the width of the interconnection part across the overlapping region in the checking data are modified to decrease the width of the interconnection part.

49. The computer program as claimed in claim 46, wherein the interconnection part is defined by an AND-operation of interconnections of the plural exposure patterns.

50. The computer program as claimed in claim 46, wherein an amount of variation in width of the interconnection part of the checking data is calculated from a predetermined defective standard.

* * * * *